(12) United States Patent
Tsao et al.

(10) Patent No.: US 10,429,422 B2
(45) Date of Patent: Oct. 1, 2019

(54) EMI TESTING DEVIATION CORRECTION SYSTEM

(71) Applicant: Dell Products L.P., Round Rock, TX (US)

(72) Inventors: Chu-Pei Tsao, New Taipei (TW);
Mao-Chen Wu, Taipei (TW);
Ching-Yuan Pai, New Taipei (TW);
Chih-Wen Huang, Taoyuan (TW);
Jeng-Hua Chiu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 739 days.

(21) Appl. No.: 14/993,828

(22) Filed: Jan. 12, 2016

(65) Prior Publication Data

US 2017/0199264 A1 Jul. 13, 2017

(51) Int. Cl.
*G01R 29/08* (2006.01)
*G01R 31/00* (2006.01)

(52) U.S. Cl.
CPC ....... *G01R 29/0814* (2013.01); *G01R 31/002* (2013.01)

(58) Field of Classification Search
CPC ... G01R 35/005; G01R 29/0814; G01R 29/26
See application file for complete search history.

(56) References Cited

U.S. PATENT DOCUMENTS

| 7,831,843 | B2 | 11/2010 | Brundridge et al. |
| 8,140,879 | B2 | 3/2012 | Chueh et al. |
| 2013/0007428 | A1 | 1/2013 | Khosrowpour et al. |

OTHER PUBLICATIONS

Harlacher, Asymmetric Artificial Networks (AAN) for Balanced Telecommunications Cables Conducted Common Mode Emissions Testing, EMC'14/Tokyo, 2014.*
M. Stecher, Measurement of emissions and immunity on telecommunication lines—a universal ISN concept for unshielded cables, IEEE International Symposium on Electromagnetic Compatability, 1999.*

(Continued)

*Primary Examiner* — Daniel R Miller
(74) *Attorney, Agent, or Firm* — Haynes and Boone, LLP

(57) ABSTRACT

An EMI testing deviation correction system includes an EMI testing facility. A signal provisioning device in the EMI testing facility includes a power connector coupling coupled to a networking port. A signal generator includes a power connector that is connected to the power connector coupling, and generates and provides signals having first signal characteristics through the power connector. An ISN device is coupled to the first networking port to receive signals that are provided by the signal generator and transmitted through the signal provisioning device. A signal receiver device is coupled to the ISN device and receives signals transmitted through the signal provisioning device and the ISN device. The signals received by the signal receiver device include second signal characteristics, and the difference between the second signal characteristics and the first signal characteristics provides an indication of at least one correction for the EMI testing facility.

20 Claims, 11 Drawing Sheets

(56) References Cited

OTHER PUBLICATIONS

Calibration Kit for CDNE, 2015, p. 5, Example for measuring the voltage division factor (figure), available at www.teseq.com/products/downloads/datasheet/CAS_CDNE.pdf.*
R3000 EMI Test Receivers, Data Sheet, 2011, p. 4.*
Impedance Stabilization Networks (ISN), available at https://web.archive.org/web/20130131062907/http://www.teseq.com/product-categories/impedance-stabilization-networks-isn.php on Dec. 31, 2013.*
Menke, Robert A., "A Full System Characterization of the Measurement Uncertainty of a Conducted Emissions Measurement System", University of Kentucky Master's Theses, 2005.*
Williams, Calibration and use of artificial mains networks and absorbing clamps, Elmac Services, 1999.*
DL-AR—Universal HDMI Adapter Ring Complete Assembly With 5 Adapters, available at https://secure.libertycable.com/products/DigitaLinx/DL-AR/Universal-HDMI-Adapter-Ring-Complete-Assembly-With-5-Adapters on Mar. 9, 2014.*
CGC-510E Datasheet—Com-Power (CGC-510E), available at https://www.com-power.com/datasheets/CGC-510E.pdf on Dec. 31, 2014.*
Wayback Machine, https://www.com-power.com/comb_generators.html on Dec. 24, 2014 (Year: 2014).*
Wayback Machine, https://www.com-power.com/comb_generators.html on Feb. 3, 2015 (Year: 2015).*
Duff, Designing Electronic Systems for EMC' (Electromagnetic Waves, 2011) DOI: IET Digital Library, https://digital-library.theiet.org/content/books/ew/sbew041e, Chapter 5 (Year: 2011).*
CGC-510E Datasheet—Com-Power (CGC-510E), available at https://www.com-power.com/datasheets/CGC-510E.pdf on Dec. 31, 2014 (Year: 2014).*

* cited by examiner

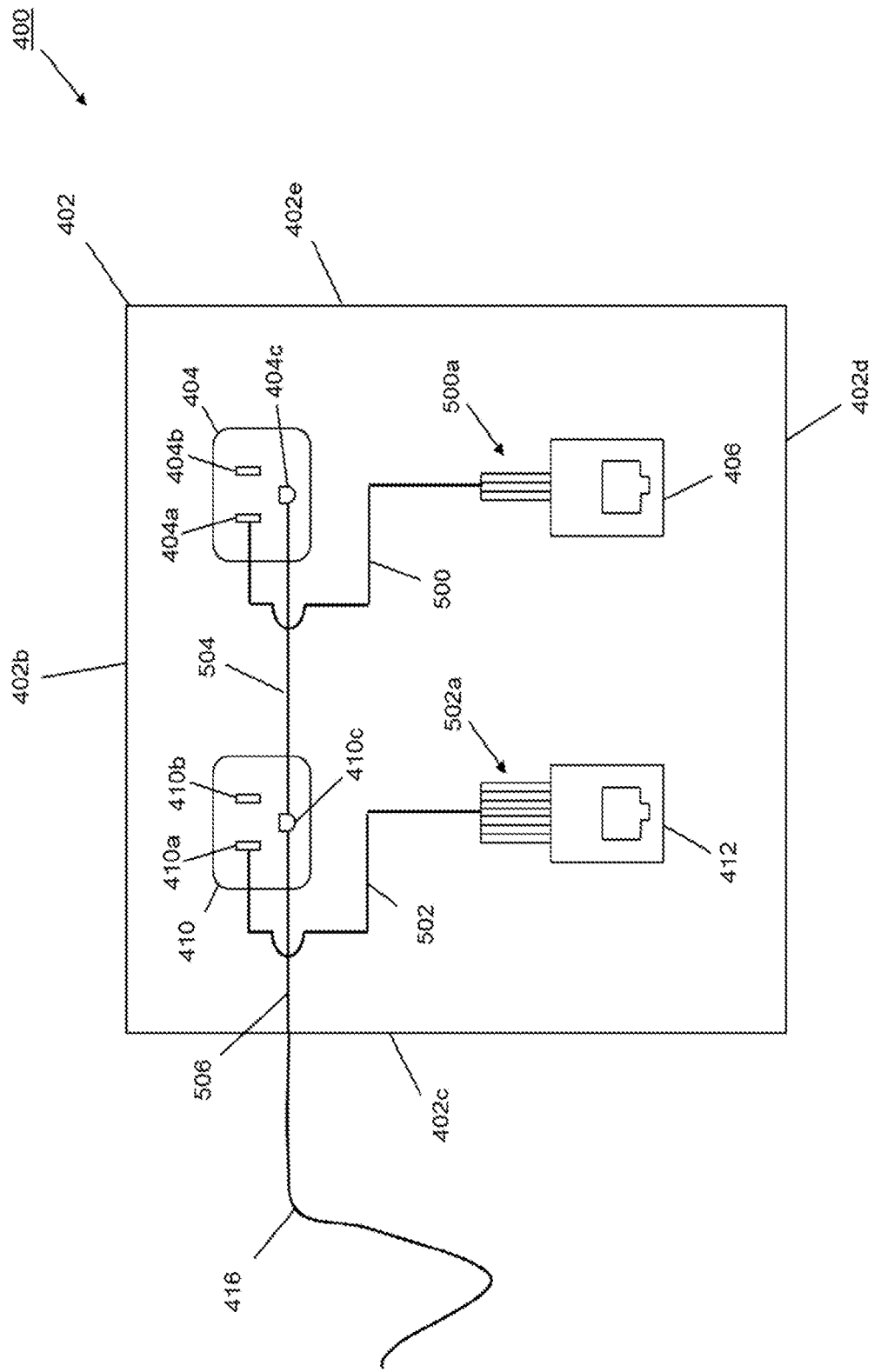

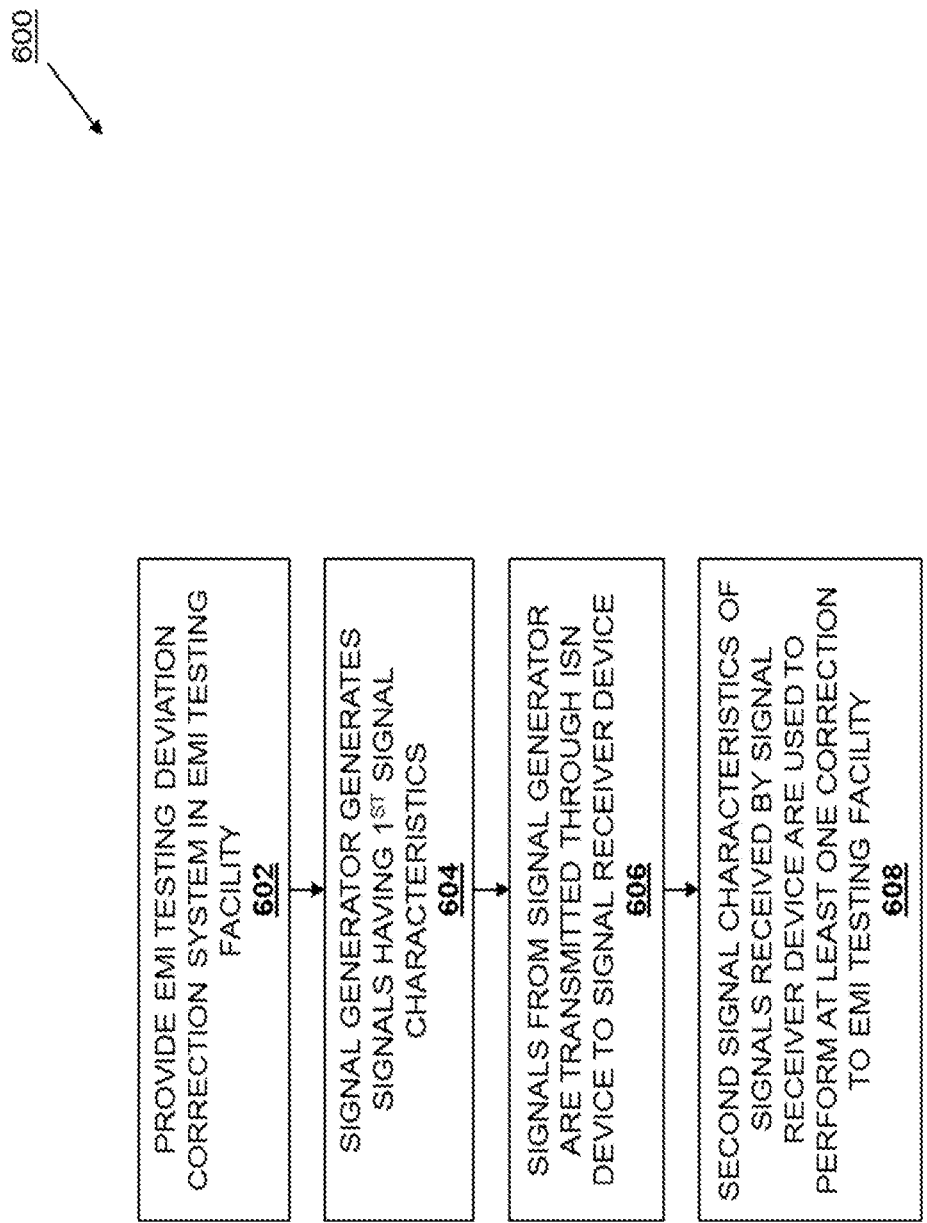

EMI TESTING DEVIATION CORRECTION SYSTEM

BACKGROUND

The present disclosure relates generally to information handling systems, and more particularly to deviation correction system for Electro Magnetic Interference (EMI) testing of information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, desktop computing systems, laptop/notebook computing systems, tablet computing systems, mobile phones, servers, switches, storage systems, and/or other computing systems known in the art, typically include ports for connecting the computing system to a variety of computing and networking components known in the art. For example, the computing system may include a networking port such as an RJ-45 networking port that is configured to connect to a networking device in order to enable the computing device to access a network, and such networking ports are required to meet EMI compliance standards (e.g., United States Federal Communications Commission (US FCC) part 15 and/or international standards). The testing for such standard may be conducted using a Line Impedance Stabilization Network (LISN) that is coupled to the computing device (typically referred to as the Equipment Under Test (EUT)), provides a known impedance, and includes a radio frequency noise measurement port that may be used to measure the EMI emitted from the networking port during operation of the computing device. However, it has been found that large deviations in EMI measurements using such LISNs may exist when such EMI testing is conducted at different testing facilities that may utilize different grounding techniques, different LISNs, and/or other EMI testing features known in the art. For example, 4-10 decibel deviations have been measured at different testing facilities between frequencies of 24.5-26 MHz, and 2-4 decibel deviations have been measured at different testing facilities at frequencies between 28-30 MHz. Such deviations can result in computing devices being manufactured and sold that do not meet EMI compliance standards, resulting in additional costs to the computing device manufacturer.

Accordingly, it would be desirable to provide an EMI testing deviation correction system.

SUMMARY

According to one embodiment, an Electro Magnetic Interference (EMI) testing deviation correction device includes a chassis; a first power connector coupling that is included in the chassis and that is configured to couple to a signal generator device; a first networking port that is included in the chassis, coupled to the first power connector coupling, and configured to couple to an Impedance Stabilization Network (ISN) device, wherein the first networking port is configured to transmit a signal that is provided to the first power connector coupling by the signal generator device to the ISN device; and a first ground connection that extends from the first power connector coupling to a ground plane, wherein the first ground connection is configured to match a second ground connection that extends from the ISN device and to the ground plane.

BRIEF DESCRIPTION OF THE DRAWINGS

FIG. 5A is a schematic view illustrating an embodiment of the signal provisioning device of FIG. 4.

FIG. 6 is a flow chart illustrating an embodiment of a method for correcting for EMI testing deviation.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
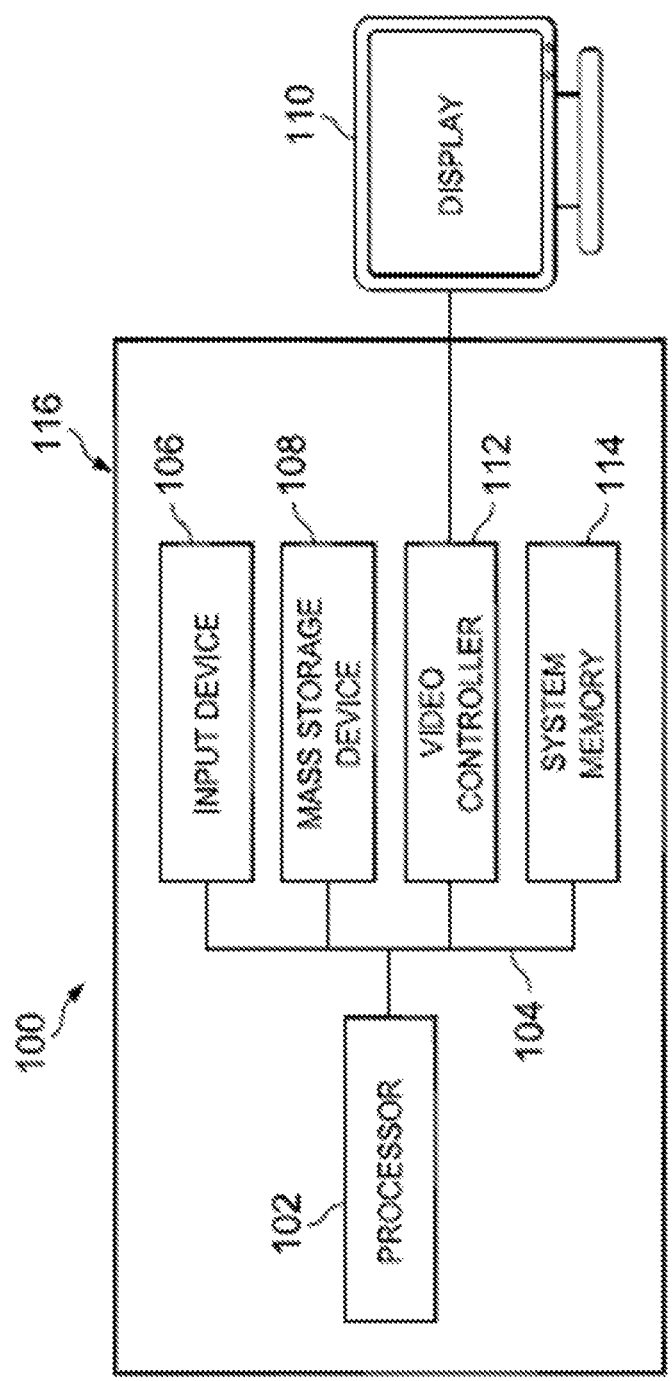
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
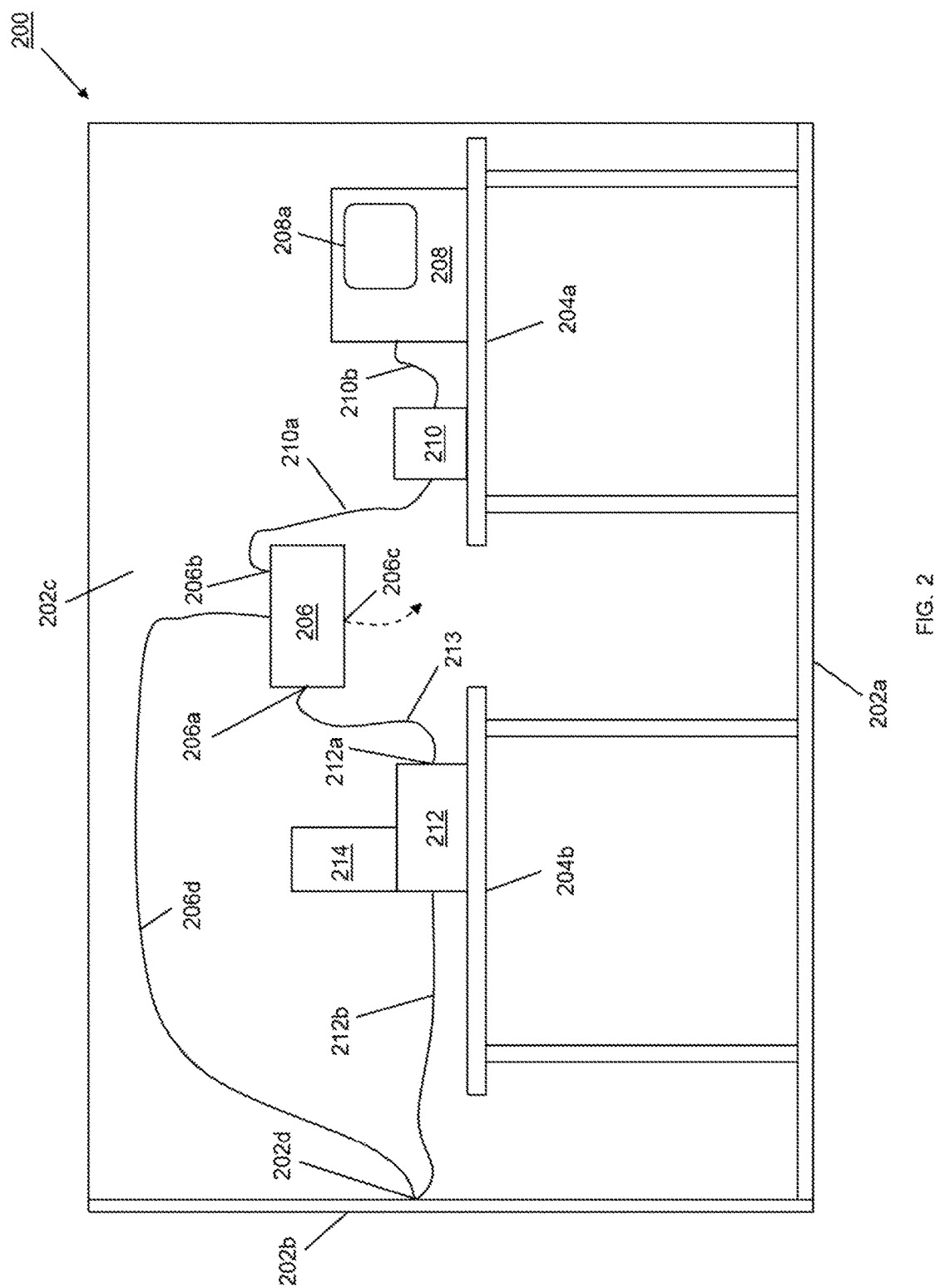
FIG. 2 is a side schematic view illustrating an embodiment of an EMI testing deviation correction system.

Referring now to FIG. 2, an embodiment of an Electro-Magnetic Interference (EMI) testing deviation correction system 200 is illustrated. In the illustrated embodiment, the EMI testing deviation correction system 200 is provided in an EMI testing facility that includes a plurality of ground planes such as the horizontal ground plane 202a and the vertical ground planes 202b and 202c, although other ground planes will fall within the scope of the present disclosure. A plurality of testing tables 204a and 204b are positioned on the horizontal ground plane 202a and adjacent the wall ground planes 202b and 202c, and each of the testing tables 204a and 204b may conform to testing standards and/or specifications for the Impedance Stabilization Network (ISN) device discussed below by including a proscribed height, distance from the horizontal ground plane 202b and/or the vertical ground planes 202b and 202c, and/or other characteristics for performing EMI testing on any particular Equipment Under Test (EUT). An Impedance Stabilization Network (ISN) device 206 is mounted to the vertical ground plane 202c and may include a variety of ISN devices known in the art such as, for example, an FCC CISPR 22 ISN device (e.g., FCC-TLISN-T4-02-09), a Teseq-T400 ISN device, and/or other ISN devices known in the art. The ISN device 206 may include one or more ports such as, for example, a T4 ISN port, a T8 ISN port, and/or other ISN test networking ports known in the art. For example, multiple different ISN devices with respective T4 ISN ports and T8 ISN ports may be utilized in the EMI testing deviation correction system 200. The ISN device 206 also includes a signal receiver connector 206b that is utilized as discussed below. The ISN device 206 also includes a computing system connector 206c that is typically used in conventional EMI testing to couple to a computing device (as indicated by the dashed line) and receive signals from that computing device, but which is not used in the EMI testing deviation correction system 200. The ISN device 206 may be used in conventional EMI testing and provides a low-pass filter that creates a known impedance, while providing a Radio Frequency (RF) noise measurement port (e.g., the signal receiver connector 206b) for measuring RF noise generated by signals produced from EUT. The ISN device 206 also includes a ground connection 206d that is coupled to a location 202d on the vertical ground plane 202b, although the coupling of the ground connection 206d to other locations on the ground planes will fall within the scope of the present disclosure.

A signal receiver device 208 is positioned on the testing table 204a and coupled to the signal receiver connector 206b on the ISN device 206. The signal receiver device 208 includes a signal receiver display 208a that is configured to display signal characteristics of signals received from the ISN device 206. In the illustrated embodiment, a pulse limiter device 210 couples the signal receiver device 208 to the ISN device 206, and may be provided to reduce voltages of signals provided from the ISN device 206 to the signal receiver device 208 if that voltage is at a level that may damage the signal receiver device 208. While the pulse limiter device 208 is illustrated as coupling the signal receiver device 208 to the ISN device 206 via cabling 210a and 210b, other couplings may be provided such as, for example, the pulse limiter device 210 connecting directly to the ISN device 206 (e.g., via the signal receiver connector 206b) or the signal receiver device 208, and/or the pulse limiter device 208 being integrated into the ISN device 206 or the signal receiver device 208. The pulse limiter device 208 may be required according to some EMI testing standards (e.g., CISPR 16-1-1:2015), and may provide an attenuator pad designed for pulse voltages up to 1500 volts and pulse energies up to 100 mWs. In other embodiments, the pulse limiter device 208 may be omitted.

A signal provisioning device 212 is located on the testing table 204b and includes at least one networking port 212a, discussed in further detail below, that is coupled to the ISN test networking port 206a on the ISN device 206 by cabling 213. The coupling 213 between the networking port 212a and the ISN test networking port 206a may be provided by networking cabling such as, for example, Ethernet cabling or other networking cabling known in the art. The ISN device 206 also includes a ground connection 212b that is coupled to a location on the vertical ground plane 202b that, in the illustrated embodiment, is the location 202d that the ground connection 206d of the ISN device 206 is coupled to, although other locations on the ground planes will fall within the scope of the present disclosure. In an embodiment, the ground connection 212b may be configured to match the ground connection 206d. For example, the ground connection 206d may be provided according to testing standards/specifications for the ISN device 206, which dictate the dimensions and/or properties of the ground connection 206d, and the ground connection 212b may be provided with matching dimensions and/or properties, which has been found to eliminate EMI test setup differences that can result in EMI testing deviations, as discussed below. In the illustrated embodiment, a signal generator 214 is illustrated as connected to the signal provisioning device 212. While the details of the signal generator 214 are discussed further below, the signal generator 214 is configured to generate signals having first signal characteristics and provide those signals to the signal provisioning device 212 for transmission through the ISN device 206 to the signal receiver device 208 where they may be received with second signal characteristics that are different than the first signal characteristics. While a specific EMI testing deviation correction system 200 is illustrated and described in FIG. 2, one of skill in the art in possession of the present disclosure will recognize that a wide variety of modifications to the components and/or configurations of the EMI testing deviation correction system 200 will fall within the scope of the present disclosure.

Figure 3A:
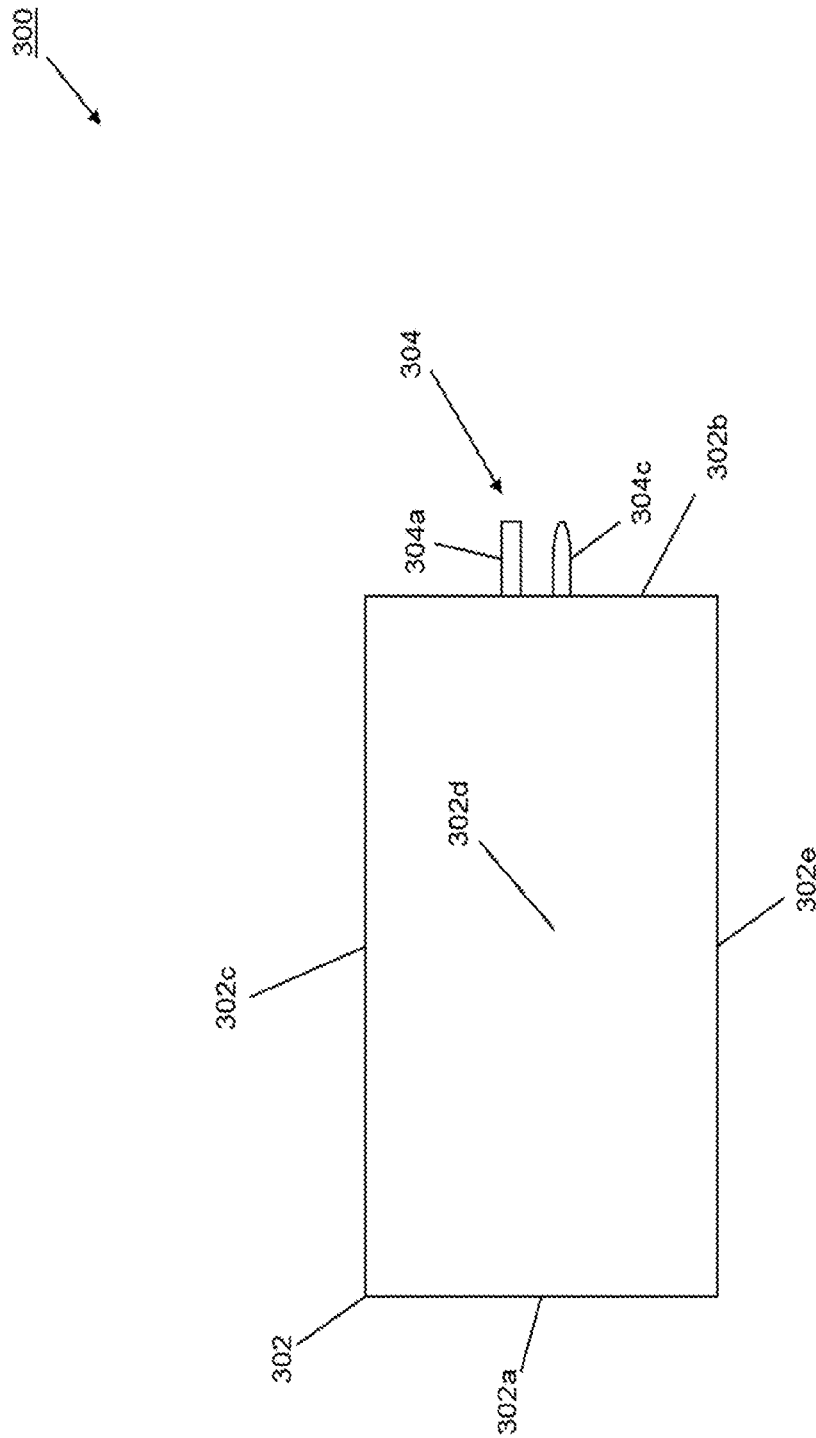
FIG. 3A is a side view illustrating an embodiment of a signal generator used in the EMI testing deviation correction system of FIG. 2.
Figure 3B:
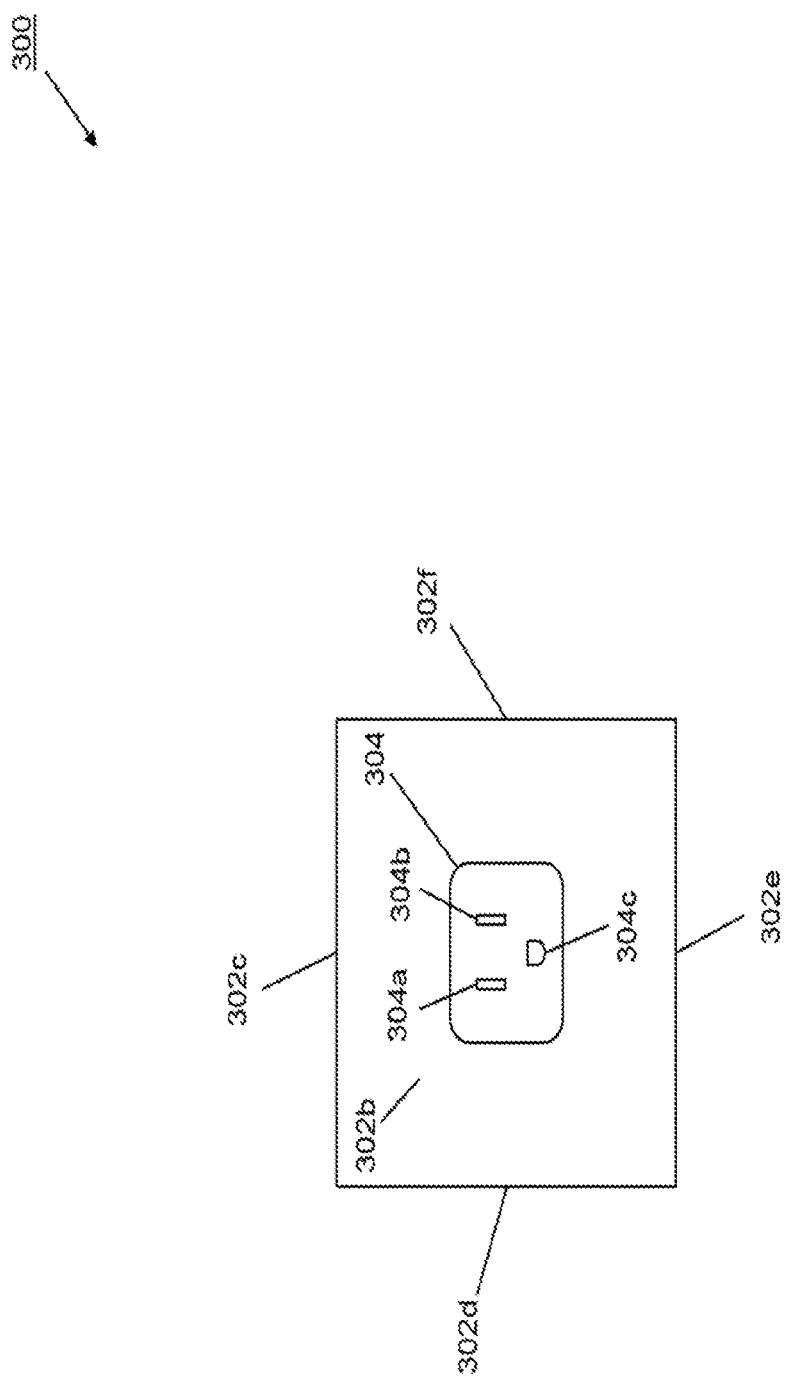
FIG. 3B is a bottom view illustrating an embodiment of the signal generator of FIG. 3A.

Referring now to FIGS. 3A and 3B, an embodiment of a signal generator 300 is illustrated. In an embodiment, the signal generator 300 may be the signal generator 214 discussed above with reference to FIG. 2. The signal generator 300 includes a chassis 302 having a top surface 302a, a bottom surface 302b that is located opposite the chassis 302 from the top surface 302a, and a plurality of side surfaces 302c, 302d, 302e, and 302f extending between the top surface 302a and the bottom surface 302b. A power connector 304 extends from the bottom surface 302b of the chassis 302, and includes a first power pin 304a, a second power pin 304b, and a ground pin 304c. While not illustrated, as discussed above the chassis 302 of the signal generator 300 may house a variety of components that are configured to generate signals having first signal characteristics and provide those signals through the power connector 304 (e.g., via the first power pin 304a and the second power pin 304b). In experimental embodiments discussed in further detail below, a CGO-510 comb generator was used as the signal generator 300 to provide those signals, but other signal generators are envisioned as falling within the scope of the present disclosure. While not illustrated, one of skill in the art in possession of the present disclosure will recognize that the chassis 302 of the signal generator 300 may include power switches, power on/off indicators, battery level indicators, battery charging ports, signal frequency selectors that may be used to dictate the frequency of the signals provided by the signal generator 300, and/or other signal generator features known in the art.

Figure 4:
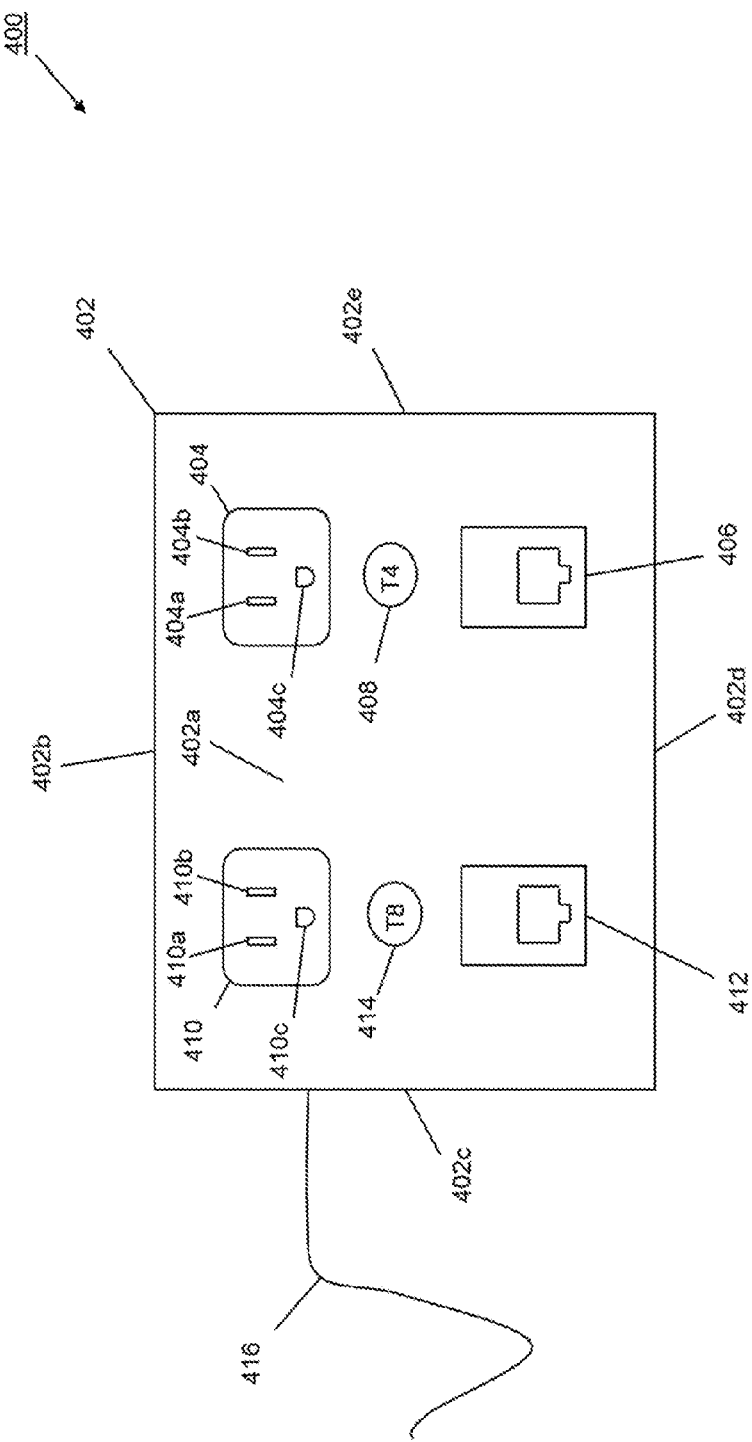
FIG. 4 is a top view illustrating an embodiment of a signal provisioning device used in the EMI testing deviation correction system of FIG. 2.

Referring now to FIG. 4, an embodiment of a signal provisioning device 400 is illustrated. In an embodiment, the signal provisioning device 400 may be the signal provisioning device 212 discussed above with reference to FIG. 2. The signal provisioning device 400 includes a chassis 402 having a top surface 402a, a bottom surface that is not visible but that is located opposite the chassis 302 from the top surface 302a, and a plurality of side surfaces 402b, 402c, 402d, and 402e extending between the top surface 302a and the bottom surface 302b. A first power connector coupling 404 is provided on the chassis 402 and includes a first power pin coupling 404a, a second power pin coupling 404b, and a ground pin coupling 404c. As discussed in further detail below, the first power connector coupling 404 is coupled to a first networking port 406 that includes a first number of lines (e.g., four lines in the embodiments discussed below, as indicated by the first networking port type indicator 408 on the top surface 402 of the chassis 400). A second power connector coupling 410 is provided on the chassis 402 and includes a first power pin coupling 410a, a second power pin coupling 410b, and a ground pin coupling 410c. As discussed in further detail below, the second power connector coupling 410 is coupled to a second networking port 412 that includes a second number of lines (e.g., eight lines in the embodiments discussed below, as indicated by the second networking port type indicator 414 on the top surface 402 of the chassis 400) that is greater than the first number of lines. In the embodiments discussed below, the first networking port 406 and the second networking port 412 are described as RJ-45 networking ports, but other networking ports (e.g., RJ11 networking ports and/or other networking ports known in the art) are envisioned as falling within the scope of the present disclosure. A ground connection 416 extends from the chassis 402, and may be the ground connection 212b discussed above with reference to FIG. 2.

Figure 5B:
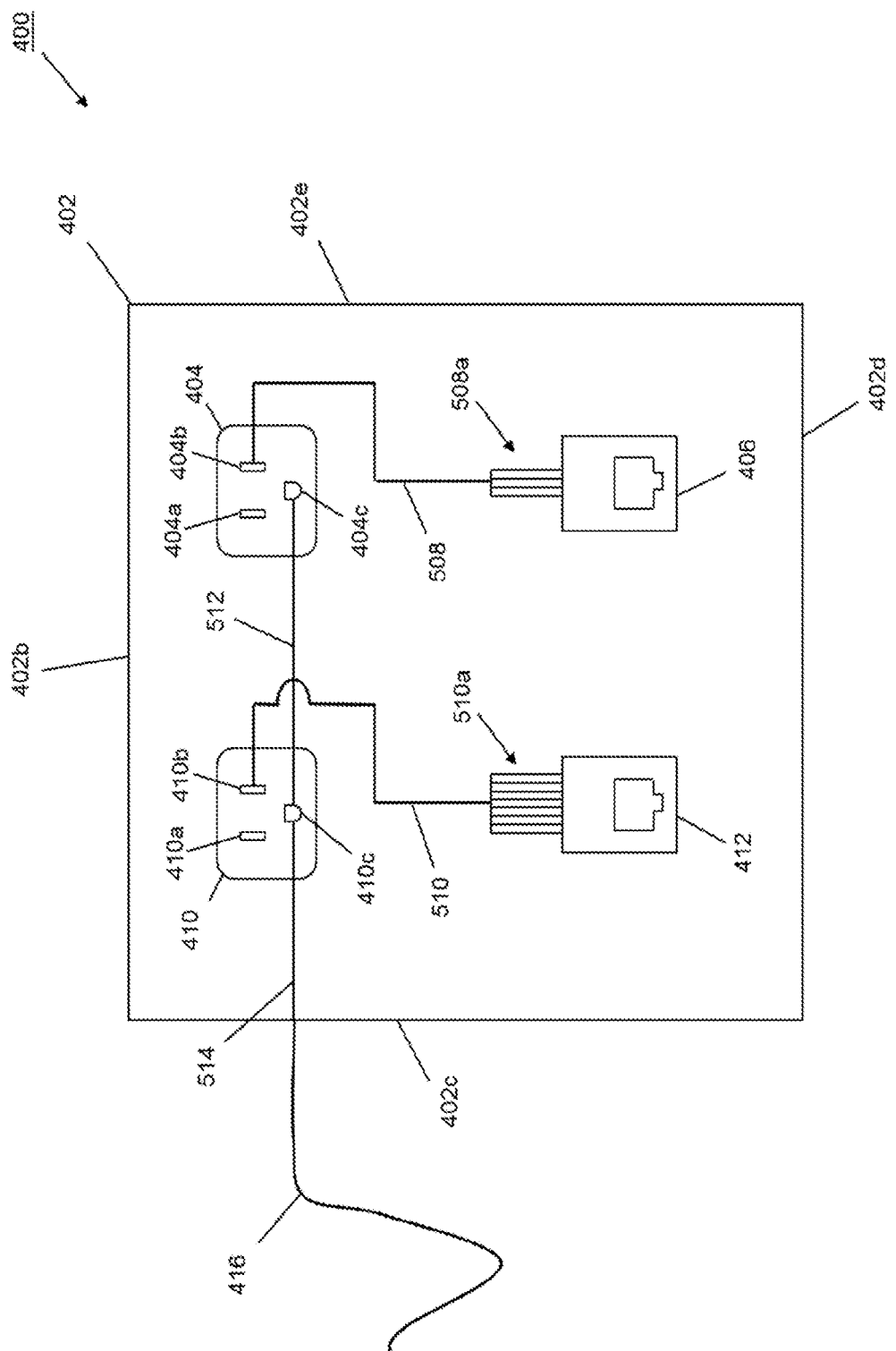
FIG. 5B is a schematic view illustrating an embodiment of the signal provisioning device of FIG. 4.

Referring now to FIGS. 5A and 5B, embodiments of the signal provisioning device 400 are illustrated. The different embodiments illustrated in FIGS. 5A and 5B illustrate different interconnections between signal provisioning device components that may be provided and, as such, similar components are given similar reference numbers. In the embodiment illustrated in FIG. 5A, the first power pin coupling 404a on the first power connector coupling 404 is connected to the first networking port 406 by cabling 500 that includes four transmission lines 500a that are coupled to the first networking port 406, and the first power pin coupling 410a on the second power connector coupling 410 is connected to the second networking port 412 by cabling 502 that includes eight transmission lines 502a that are coupled to the second networking port 412. The ground connection 416 is coupled to each of the ground pin coupling 404c on the first power connection coupling 404 and the ground pin coupling 410c on the second power connection coupling 410 by ground cabling 504 extending between the ground pin coupling 404c on the first power connection coupling 404 and the ground pin coupling 410c on the second power connection coupling 410, and ground cabling 506 that provides a portion of the ground connection 416 that is housed in the chassis 402.

In the embodiment illustrated in FIG. 5B, the second power pin coupling 404b on the first power connector coupling 404 is connected to the first networking port 406 by cabling 508 that includes four transmission lines 508a that are coupled to the first networking port 406, and the second power pin coupling 410b on the second power connector coupling 410 is connected to the second networking port 412 by cabling 510 that includes eight transmission lines 510a that are coupled to the second networking port 412. The ground connection 416 is coupled to each of the ground pin coupling 404c on the first power connection coupling 404 and the ground pin coupling 410c on the second power connection coupling 410 by ground cabling 512 extending between the ground pin coupling 404c on the first power connection coupling 404 and the ground pin coupling 410c on the second power connection coupling 410, and ground cabling 514 that provides a portion of the ground connection 416 housed in the chassis 402. While a few specific examples of the signal provisioning device 400 have be illustrated and described, one of skill in the art in possession of the present disclosure will recognize that use of different components and configurations of the signal provisioning device 400 will fall within the scope of the present disclosure.

Referring now to FIG. 6, an embodiment of a method 600 for correcting Electro Magnetic Interference (EMI) testing deviation is illustrated. As discussed below, a signal provisioning device may be provided that allows a signal generator to provide signals having known first signal characteristics directly to an ISN device, which then transmits those signals to a signal receiver device that measures second signal characteristics of those signals that are different than the known first signal characteristics. The differences between the second signal characteristics and the first signal characteristics of the signals provides an EMI testing deviation that may be a result of issues with the EMI testing facility, and may be utilized to perform one or more corrective actions to the EMI testing facility. As would be understood by one of skill in the art in possession of the present disclosure, the signal provisioning device replaces the equipment under test that would be used in a normal EMI test, and enables the determination of EMI testing deviations due to issues such as grounding in the EMI testing facility and/or miscalibration of the ISN device by providing a pass-through such that the signals generated by the signal generator and received by the signal receiver device should have the same characteristics, and thus differences in those signals may be measured and minimized to minimized EMI testing deviations.

In specific embodiments, the results of previous performances of the method 600 at different EMI testing facilities may be used with the results from the performance of the method 600 at any particular EMI testing facility to determine the relative level of EMI testing deviation occurring, and in some examples, a threshold level of EMI testing deviation may be set above which the corrective actions will be performed in order to cause EMI testing deviations at that EMI testing facility to be reduced below that threshold level. As such, the systems and methods described herein provide the ability to calibrate EMI testing facilities to reduce EMI testing deviations that result in computing devices being manufactured and sold that do not meet EMI compliance standards, and result in EMI testing that is consistent across EMI testing facilities (and the possibly different equipment used in those EMI testing facilities).

Figure 7:
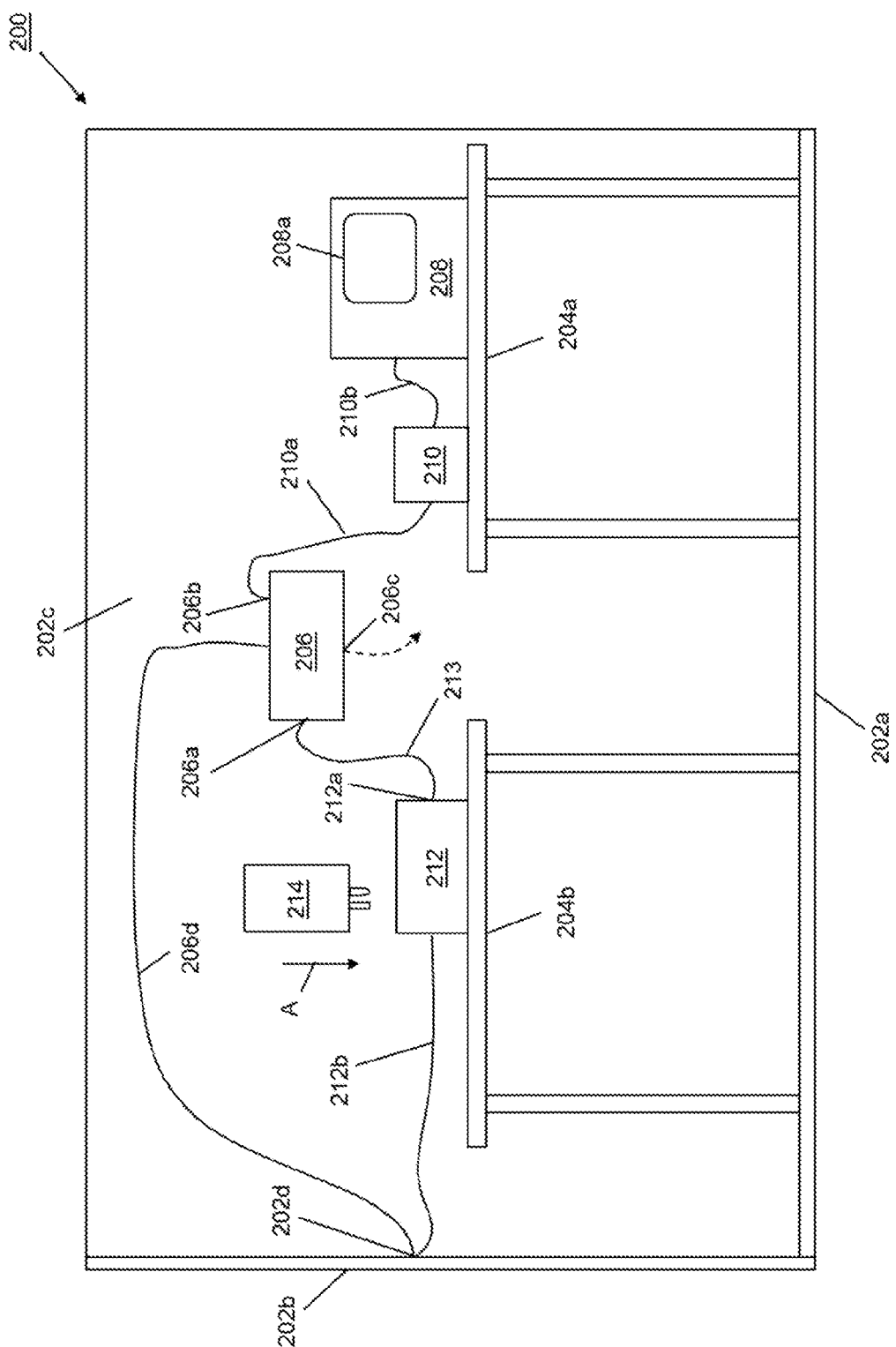
FIG. 7 is a side schematic view illustrating an embodiment of the signal generator of FIGS. 3A and 3B being coupled to the signal provisioning device of FIGS. 5A and 5B in EMI testing deviation correction system of FIG. 2.

The method 600 begins at block 602 where an EMI testing deviation correction system is provided in an EMI testing facility. In an embodiment, the EMI testing deviation correction system 200 may be provided in the EMI testing facility illustrated and described above with reference to FIG. 2. For example, the ISN device 206 may be mounted to the vertical ground plane 202c and coupled to the signal receiver device 208 that is positioned on the testing table 204a (e.g., directly or through the pulse limiter device 210 as illustrated). The ground connection 206d for the ISN device 206 may also be coupled to the location 202d on the vertical ground plane 202b. The signal provisioning device 212 may be positioned on the testing table 204b, and the ground connection 212b for the signal provisioning device 212 coupled to the location 202d on the vertical ground plane 202b. As illustrated in FIGS. 2 and 7, the signal generator 214/300 may then be positioned adjacent the signal provisioning device 212/400 such that the power connector 304 on the signal generator 214/300 is aligned with one of the first power connector coupling 404 or the second power connector coupling 410 on the signal provisioning device 212/400, and the signal generator 214/300 may then be moved in a direction A such that the power connector 304 engages that power connector coupling. The cabling 213 may then be coupled to the networking port that is coupled to the power connector coupling to which the signal generator 214 is engaged, as well as to a correspond networking port on the ISN device 206, as discussed below.

Figure 8:
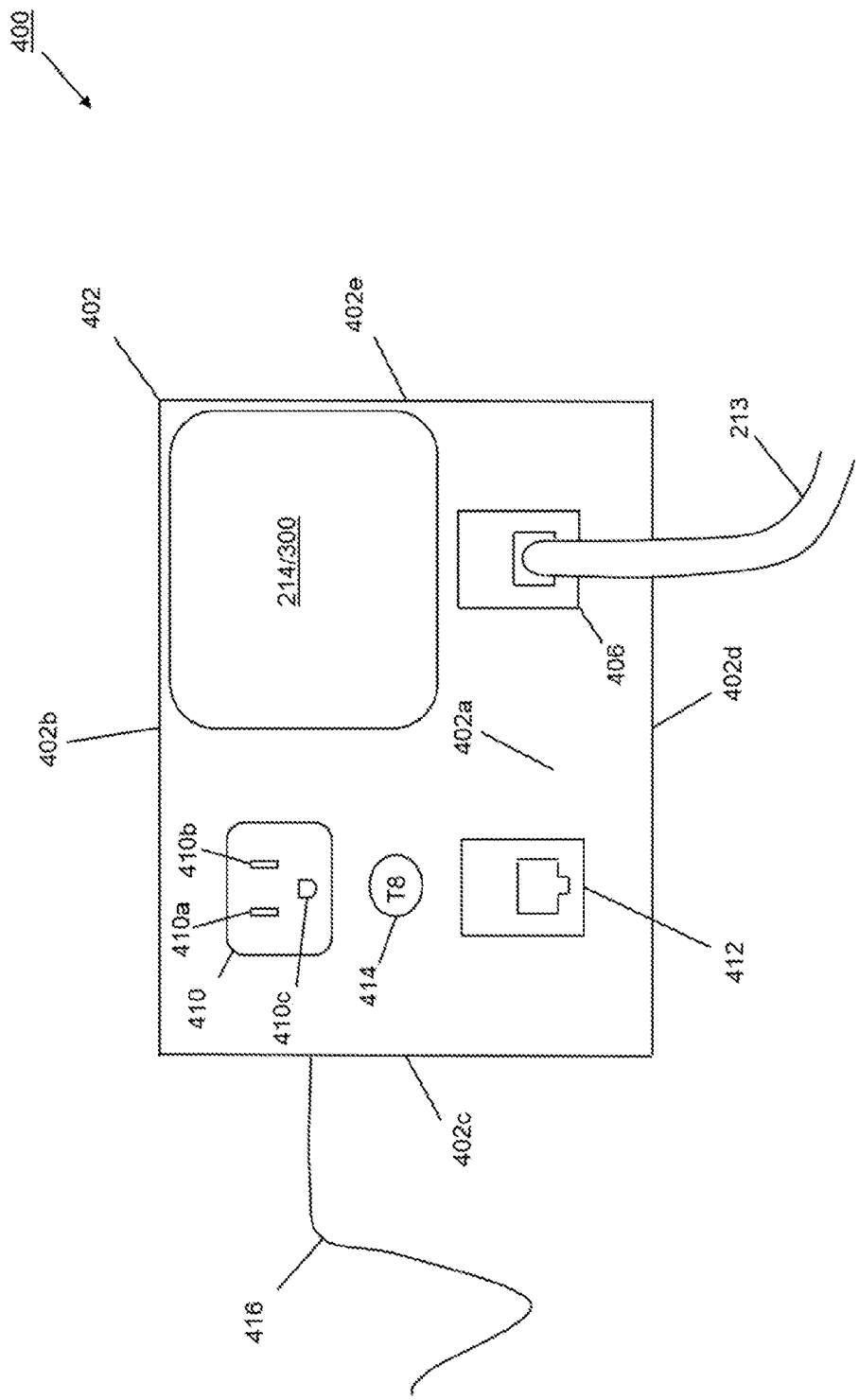
FIG. 8 is a top view illustrating an embodiment of the signal generator of FIGS. 3A and 3B coupled to the signal provisioning device of FIGS. 5A and 5B in EMI testing deviation correction system of FIG. 2.
Figure 9:
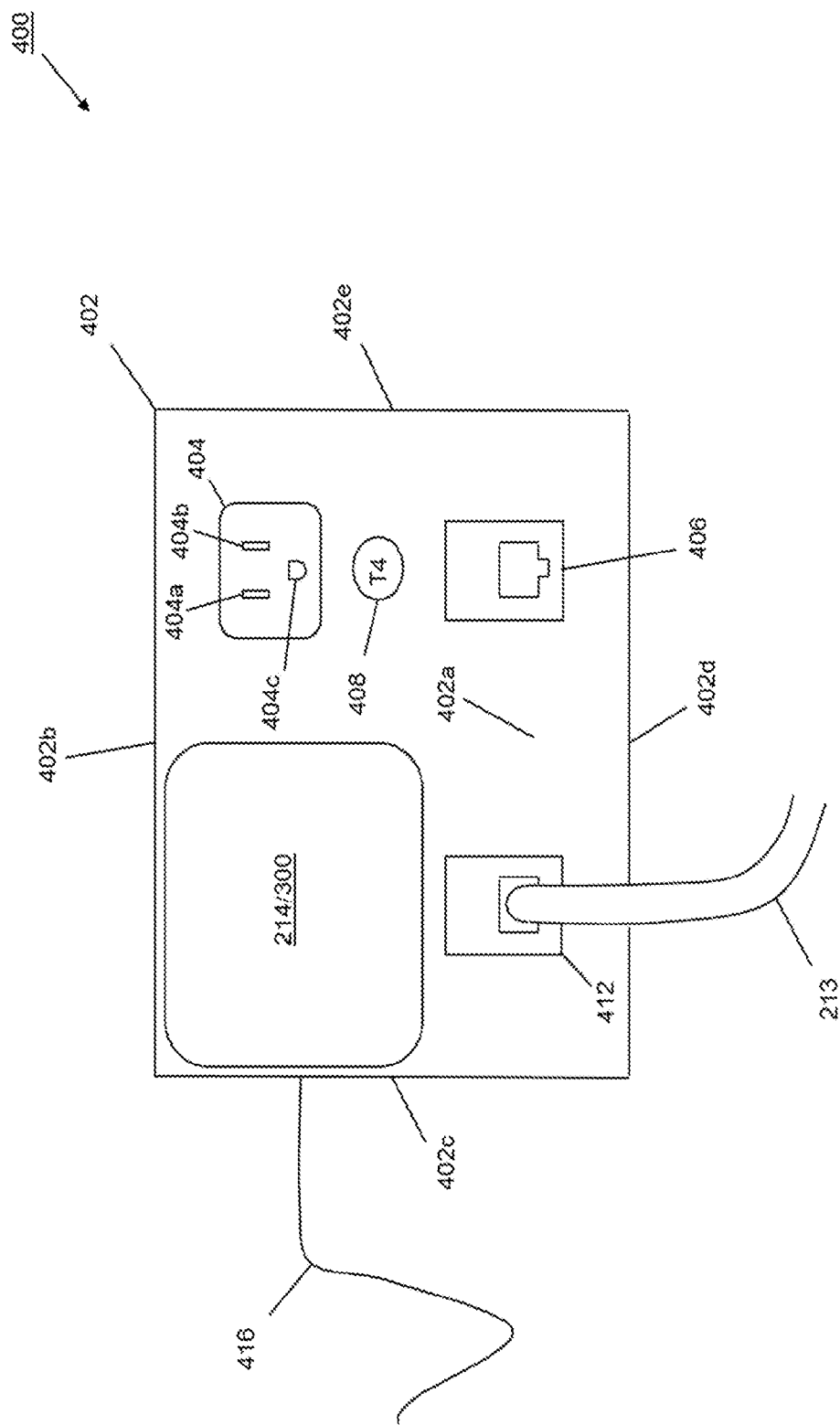
FIG. 9 is a top view illustrating an embodiment of the signal generator of FIGS. 3A and 3B coupled to the signal provisioning device of FIGS. 5A and 5B in EMI testing deviation correction system of FIG. 2.

For example, with reference to FIG. 8, the signal generator 214/300 is illustrated as coupled to the first power connector coupling 404 on the signal provisioning device 212/400, and the cabling 213 is illustrated as coupled to the first networking port 406. While not illustrated, the cabling 213 may also be coupled to the ISN test networking port 206a (e.g., a T4 ISN port in the ISN device 206.) As such, FIG. 8 provides an example of the signal generator 214/300 and cabling 213 configured with the signal provisioning device 212/400 and the ISN device 206 to provide signals having a particular frequency, which one of skill in the art in possession of the present disclosure will recognize may be signals having frequencies between approximately 10 and 100 megahertz (MHz), although other signal frequencies will fall within the scope of the present disclosure. In another example, with reference to FIG. 9, the signal generator 214/300 is illustrated as coupled to the second power connector coupling 410 on the signal provisioning device 212/400, and the cabling 213 is illustrated as coupled to the second networking port 412. While not illustrated, the cabling 213 may also be coupled to the IHS test networking port 206a (e.g., a T8 ISN port in the ISN device 206.) As such, FIG. 9 provides an example of the signal generator 214/300 and cabling 213 configured with the signal provisioning device 212/400 and the ISN device 206 to provide signals having a particular frequency, which one of skill in the art in possession of the present disclosure will recognize may be signals having frequencies of approximately 1 gigahertz (GHz), although other signal frequencies will fall within the scope of the present disclosure. As such, with the EMI testing deviation correction system 200 provided as illustrated in FIG. 2, with the signal generator 214 coupled to one of the power connection couplings on the signal provisioning device 212, and with cabling 213 coupling a corresponding networking port on the signal provisioning device 212 to the appropriate networking port on the ISN device 206, the EMI testing deviation correction system 200 is set up to determine deviations in EMI testing results due to some factor in the EMI testing facility.

In experimental embodiments, the ground connection 212b extending from the signal provisioning device 212 to the vertical ground plane 202b was provided with at least a 2 millimeter diameter and at least a 0.8 meter length, dimensions that matched (or substantially matched) the dimensions of the ground connection 206d between the ISN device 206 and the vertical ground plane 202b. The cabling 213 between the signal provisioning device 212 and the ISN device 206 was provided with a length of 0.8-1.5 meters when used with 10-100 MHz signals, 1 GHz signals, and up to 10 GHz signals. While the cabling dimensions discussed above were found to reduce external noise from being introduced into the EMI testing process discussed below, other cabling dimensions will fall within the scope of the present disclosure.

The method 600 then proceeds to block 604 where the signal generator generates signals having first characteristics. In an embodiment, at block 604 the signal generator 214/300 may be powered on, activated, or otherwise caused to begin to generate signals having first signal characteristics that are defined by the signal generator 214/300 or otherwise known to a user of the signal generator 214/300. For example, at block 604 the signal generator 214/300 may generate signals having known values, amplitude, and frequencies. In the experimental embodiments discussed below, the signals generated by the signal generator 214/300 at block 604 include, for each known frequency level, a known quasi-peak and a known average peak. However, signals generated by the signal generator 214 may include other known signal characteristics while remaining within the scope of the present disclosure.

The method 600 then proceeds to block 606 where the signals from the signal generator are transmitted through the ISN device to the signal receiver device. For example, with reference to FIG. 8, when the signal generator 214/300 is connected to the first power connector 404, the signal generator 214/300 may generate signals between approximately 10 and 100 MHz that are provided through the first power pin 304a and the second power pin 304b on the power connector 304. In the experimental embodiments discussed below, signals between 0.15 MHz and 30 MHz were generated. Those signals may then be transmitted by cabling 500 (via the first power pin coupling 404a on the first power connector 404 as illustrated in FIG. 5A) or by the cabling 508 (via the second power pin coupling 404b on the first power connector 404 as illustrated in FIG. 5B) such that the signals are provided through each of the four transmission lines 500a or 508a to the first networking port 406. The signals are then transmitted out of the first networking port 406 and through the cabling 213 to the T4 ISN port on the ISN device 206. In another example, with reference to FIG. 9, when the signal generator 214/300 is connected to the second power connector 410, the signal generator 214/300 may generate signals around approximately 1 GHz that are provided through the first power pin 304a and the second power pin 304b on the power connector 304. Those signals may then be transmitted by cabling 502 (via the first power pin coupling 404a on the second power connector 410 as illustrated in FIG. 5A) or by the cabling 510 (via the second power pin coupling 404b on the second power connector 410 as illustrated in FIG. 5B) such that the signals are provided through each of the eight transmission lines 502a or 510a to the second networking port 412. The signals are then transmitted out of the second networking port 406 and through the cabling 213 to the T8 ISN port on the ISN device 206.

Signals received by the ISN device 206 (e.g., through the T4 ISN port or the T8 ISN port as discussed above) are then transmitted through the ISN device 206. As would be understood by one of skill in the art in possession of the present disclosure, during EMI testing, the ISN device 206 may filter power mains noise from the EUT, provide a known impedance to the EUT, and allow conducted interference voltage produced by the EUT to be measured by the signal receiver device 208. The impedance versus frequency of the ISN device will generally match the requirements of a test specification being applied, and thus an EMI testing facility may include a plurality of different types of ISN devices, any of which may be utilized in the EMI testing deviation correction system 200. Thus, the signal transmitted through the ISN device 206 may be provided to the signal receiver device 208 (e.g., via the cabling 210a and 210b and, in some embodiments, through the pulse limiter device 210), and in some embodiments, the signals arriving at the signal receiver device 208 may include second signal characteristics that are different than the first signal characteristics provided with the signals generated at the signal generator 214.

The method 600 the proceeds to block 608 where second signal characteristics of signals received by the signal receiver device are used to perform at least one correction to the EMI testing facility. In an embodiment, the second signal characteristics of the signals received at the signal receiver device 208 may then be recorded and compared to the first signal characteristics of the signals generated by the signal generator 214, as well as second signal characteristics of signals received at signal receiver device(s) at different EMI testing facilities. For example, the chart below illustrates, for each of a plurality of signal frequencies provided during testing, the signal characteristics of signals generated by the signal generator 214, and signal characteristics of signals received by the signal receiver device 208. While only a few signal frequencies are provided in the chart below, one of skill in the art in possession of the present disclosure will recognize that a large number of frequencies (e.g., 0.1-100 MHZ, up to 1 GHz, etc) may, and typically will, be tested. The first column of the chart provides the frequencies at which the signals were provided, while the second and third columns provide the quasi-peak and average peak of the signals generated by the signal generator 214 at each frequency, the fourth and fifth columns provide the quasi-peak and average peak of the signals received by the signal receiver device 208 signals at each frequency, and the sixth and seventh columns provide the quasi-peak deviation and average peak deviation between the signals generated by the signal generator 214 and the signals received by the signal receiver device 208 signals at each frequency:

| FREQUENCY MHz | 100 MB (generated) | | 100 MB (received) | | 100 MB (deviation) | |
|---|---|---|---|---|---|---|
| | QP (dbµv) | AV (dbµv) | QP (dbµv) | AV (dbµv) | QP (dbµv) | AV (dbµv) |
| 24 | 65.8 | 66.1 | 63.6 | 64.3 | 2.2 | 1.8 |
| 24.5 | 65.9 | 66.1 | 63.3 | 64.0 | 2.6 | 2.1 |
| 25 | 62.8 | 63.1 | 58.8 | 59.6 | 4.0 | 3.5 |
| 25.5 | 68.1 | 68.4 | 63.7 | 64.4 | 4.5 | 4.0 |
| 26 | 65.8 | 66.0 | 64.2 | 64.9 | 1.6 | 1.1 |
| 26.5 | 65.9 | 66.2 | 66.7 | 67.4 | −0.8 | −1.3 |
| 27 | 62.5 | 62.8 | 63.7 | 64.5 | −1.2 | −1.7 |

In some embodiments, a threshold for deviations may be set that, above which, corrective actions may be performed. For example, in experimental embodiments using the data in the chart above, a threshold deviation of 1 decibel (in microvolts) was set, and thus most of the received signals showed a deviation that exceeded that threshold (e.g., except for the quasi-peak at 26.5 MHz.) Such deviations can result from grounding issues at the EMI testing facilities, issues with the ISN device, and/or a variety of other EMI testing facility issues known in the art. However, using data such as that in the chart above, at block 608 one or more corrections to the EMI testing facility may be performed to calibrate the EMIT testing facility. For example, industry specifications may be implemented to lower the ground impedance, the impedance between the ISN device 206 and the ground plane(s) may be matched, the impedance between connectors may be verified to meet industry requirements, the ISN device may be calibrated based on the deviation vs. frequency data above, and/or other corrections may be performed on the EMI testing facility in order to reduce the deviations between the signals generated by the signal generator 214 and the signal receiver device 208. In an experimental embodiment, corrections to the EMI testing facility resulted in the data in the chart below, and as can be seen, deviations were reduced to below 1 decibel at each of the frequencies tested:

| FREQUENCY MHz | 100 MB (generated) | | 100 MB (received) | | 100 MB (deviation) | |
|---|---|---|---|---|---|---|
| | QP (dbµv) | AV (dbµv) | QP (dbµv) | AV (dbµv) | QP (dbµv) | AV (dbµv) |
| 24 | 65.8 | 66.1 | 65.0 | 65.2 | 0.8 | 0.9 |
| 24.5 | 65.9 | 66.1 | 65.0 | 65.2 | 0.9 | 0.9 |
| 25 | 62.8 | 63.1 | 62.0 | 62.3 | 0.8 | 0.8 |
| 25.5 | 68.1 | 68.4 | 67.5 | 67.7 | 0.6 | 0.7 |
| 26 | 65.8 | 66.0 | 64.9 | 65.1 | 0.9 | 0.9 |
| 26.5 | 65.9 | 66.2 | 65.3 | 65.4 | 0.6 | 0.8 |
| 27 | 62.5 | 62.8 | 61.9 | 62.1 | 0.6 | 0.7 |

Furthermore, deviations across different EMI testing facilities may enable the recognition of common deviations associated with particular ISN devices, at particular frequencies, with particular grounding techniques or connections, and/or other deviation characteristics. As such, the comparison of the results of the method 600 across different EMI testing facilities provides benefits in the recognition and correction of EMI testing deviations that otherwise might go unrecognized and uncorrected. The corrections to the EMI testing facility can result in the minimization of EMI testing deviations that may result due to issues with the EMI testing facility, and using the techniques taught herein to minimize such testing deviations across EMI testing facilities provides for EMI testing across different EMI testing facilities that is more accurate, thus improving the results of EMI testing of computing devices and eliminating the manufacture of computing devices that produce emissions that do not meeting EMI standards.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An Electro Magnetic Interference (EMI) testing deviation correction system, comprising:
    an EMI testing facility;
    a signal provisioning device that is included in the EMI testing facility and that includes a first power connector coupling and a first networking port that is coupled to the first power connector coupling via cabling;
    a signal generator that is included in the EMI testing facility and that includes a power connector that is connected to the power connector coupling on the signal provisioning device, wherein the signal generator is configured to generate signals having first signal characteristics and provide the signals through the power connector, and wherein the cabling, the first power connector coupling, and the first networking port included in the signal provisioning device are configured to provide a pass-through such that the signals generated by signal generator have the first signal characteristics when transmitted through the first networking port;
    an Impedance Stabilization Network (ISN) device that is included in the EMI testing facility and that is configured to couple to the first networking port on the signal provisioning device to receive signals that are provided by the signal generator through power connector and that are transmitted through the signal provisioning device from the first power connector coupling to the first networking port; and
    a signal receiver device that is included in the EMI testing facility and that is coupled to the ISN device and configured to receive signals transmitted through the signal provisioning device and the ISN device, wherein the signals received by the signal receiver device include second signal characteristics that are different than the first signal characteristics, and wherein the difference between the second signal characteristics and the first signal characteristics provides an indication of at least one correction for the EMI testing facility.

2. The EMI testing deviation correction system of claim 1, further comprising:
    a pulse limiter device that is included in the EMI testing facility and that is coupled between the ISN device and the signal receiver device.

3. The EMI testing deviation correction system of claim 1, wherein the signal provisioning device includes a second power connector coupling and a second networking port that is coupled to the second power connector coupling, and wherein the ISN device is configured to couple to the second networking port on the signal provisioning device to receive signals that are provided by the signal generator through power connector and that are transmitted through the signal provisioning device from the second power connector coupling to the second networking port.

4. The EMI testing deviation correction system of claim 3, wherein first networking port provides a four-line networking port, and wherein the second networking port provides an eight-line networking port.

5. The EMI testing deviation correction system of claim 1, further comprising:
    a first ground connection extending from the signal provisioning device and to a ground plane, wherein the first ground connection is configured to match a second ground connection extending from the ISN device and to the ground plane.

6. The EMI testing deviation correction system of claim 5, wherein the first ground connection and the second ground connection are grounded to a common location on the ground plane.

7. The EMI testing deviation correction system of claim 1, wherein the at least one correction for the EMI testing facility includes at least one of a calibration of the ISN device and a modification to the EMI testing facility.

8. An Electro Magnetic Interference (EMI) testing deviation correction device, comprising:
    a chassis;
    a first power connector coupling that is included in the chassis and that is configured to couple to a signal generator device;
    a first networking port that is included in the chassis, coupled to the first power connector coupling via cabling, and configured to couple to an Impedance Stabilization Network (ISN) device, wherein the first networking port is configured to transmit a signal that is provided to the first power connector coupling by the signal generator device to the ISN device, and wherein the cabling, the first power connector coupling, and the first networking port are configured to provide a pass-through such that the signals generated by the signal generator device and having first signal characteristics when received by the first power connector coupling have the first signal characteristics when transmitted through the first networking port; and a first ground connection that extends from the first power connector coupling to a ground plane, wherein the first ground connection is configured to match a second ground connection that extends from the ISN device and to the ground plane.

9. The EMI testing deviation correction device of claim 8, further comprising:

a second power connector coupling that is included in the chassis and that is configured to couple to the signal generator device, wherein the first ground connection extends from the second power connector coupling to the ground plane; and a second networking port that is included in the chassis, coupled to the second power connector coupling, and configured to couple to the ISN device, wherein the second networking port is configured to transmit a signal that is provided to the second power connector coupling by the signal generator device to the ISN device.

10. The EMI testing deviation correction device of claim 9, wherein first networking port provides a four-line networking port, and wherein the second networking port provides an eight-line networking port.

11. The EMI testing deviation correction device of claim 10, wherein the first networking port is configured to couple to a T4 ISN port on the ISN device, and wherein the second networking port is configured to couple to a T8 ISN port on the ISN device.

12. The EMI testing deviation correction device of claim 8, wherein the first power connector coupling includes a plurality of power pin couplings and a ground pin coupling, and wherein the first networking port is coupled to one of the power pin couplings and the first ground connection is coupled to the ground pin coupling.

13. The EMI testing deviation correction device of claim 8, wherein the first ground connection is grounded to a common location on the ground plane as the second ground connection that extends from the ISN device.

14. A method for correcting for Electro Magnetic Interference (EMI) testing deviation, comprising:

coupling, in an EMI testing facility, a power connector on a signal generator device to a power connector coupling on a signal provisioning device;

coupling, in the EMI testing facility, an Impedance Stabilization Network (ISN) device to the signal provisioning device through a networking port that is coupled to the power connector coupling via cabling, wherein a signal receiver device is coupled to the ISN device;

generating, by the signal generator device, signals having first signal characteristics and providing the signals through the power connector;

transmitting, by the signal provisioning device, signals that are received at the power connector coupling from the signal generator device to the ISN device through networking port, wherein the cabling, the power connector coupling, and the networking port included in the signal provisioning device are configured to provide a pass-through such that the signals transmitted through the networking port should have the first signal characteristics;

receiving, by the signal receiver device, signals transmitted through the signal provisioning device and the ISN device, wherein the signals received by the signal receiver device include second signal characteristics that are different than the first signal characteristics; and using the difference between the second signal characteristics and the first signal characteristics to perform of at least one correction for the EMI testing facility.

15. The method of claim 14, further comprising:

transmitting, by a pulse limiter device that is coupled between the ISN device and the signal receiver device, the signals.

16. The method of claim 14, wherein the power connector coupling and the networking port are one of 1) a first power connector coupling and first networking port pair included on the signal provisioning device, and 2) a second power connector coupling and second networking port pair included on the signal provisioning device.

17. The method of claim 16, wherein first networking port pair provides a four-line networking port, and wherein the second networking port pair provides an eight-line networking port.

18. The method of claim 14, further comprising:

connecting a first ground connection that extends from the signal provisioning device to a ground plane, wherein the first ground connection is configured to match a second ground connection extending from the ISN device and to the ground plane.

19. The method of claim 18, wherein the first ground connection is grounded to a common location on the ground plane as the second ground connection.

20. The method of claim 14, wherein the at least one correction for the EMI testing facility includes at least one of a calibration of the ISN device and a modification to the EMI testing facility.

* * * * *